(12) United States Patent
Hoss et al.

(10) Patent No.: US 7,719,839 B2
(45) Date of Patent: May 18, 2010

(54) HEAT CONDUCTION APPARATUS PROVIDING FOR SELECTIVE CONFIGURATION FOR HEAT CONDUCTION

(75) Inventors: Shawn Paul Hoss, Round Rock, TX (US); David Lyle Moss, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 11/676,422

(22) Filed: Feb. 19, 2007

(65) Prior Publication Data

US 2008/0198551 A1 Aug. 21, 2008

(51) Int. Cl.
H05K 7/20 (2006.01)
F28F 7/00 (2006.01)
H01L 23/26 (2006.01)

(52) U.S. Cl. .............. 361/702; 361/703; 361/710; 361/711; 165/80.3; 165/80.4; 174/16.3

(58) Field of Classification Search ............... 361/702
See application file for complete search history.

(56) References Cited

U.S. PATENT DOCUMENTS

| 5,370,178 | A | * | 12/1994 | Agonafer et al. | 165/137 |
| 5,482,113 | A | * | 1/1996 | Agonafer et al. | 165/137 |
| 5,583,317 | A | * | 12/1996 | Mennucci et al. | 174/16.3 |
| 5,969,949 | A | * | 10/1999 | Kim et al. | 361/704 |
| 5,969,950 | A | * | 10/1999 | Tantoush | 361/704 |
| 5,982,616 | A | * | 11/1999 | Moore | 361/687 |
| 6,115,251 | A | | 9/2000 | Patel et al. | |
| 6,298,669 | B1 | * | 10/2001 | Maruyama et al. | 62/3.2 |
| 6,359,781 | B1 | * | 3/2002 | Hoss et al. | 361/687 |
| 6,377,459 | B1 | * | 4/2002 | Gonsalves et al. | 361/700 |
| 6,421,240 | B1 | * | 7/2002 | Patel | 361/699 |
| 6,496,375 | B2 | * | 12/2002 | Patel et al. | 361/719 |
| 6,538,889 | B1 | * | 3/2003 | Barsun et al. | 361/704 |
| 6,625,025 | B1 | * | 9/2003 | Duxbury et al. | 361/704 |
| 6,687,126 | B2 | * | 2/2004 | Patel et al. | 361/702 |
| 6,808,013 | B2 | * | 10/2004 | Lai et al. | 165/80.4 |
| 6,829,145 | B1 | * | 12/2004 | Corrado et al. | 361/704 |
| 6,958,912 | B2 | * | 10/2005 | Pokharna et al. | 361/700 |
| 6,966,361 | B2 | * | 11/2005 | Connors | 165/104.33 |
| 6,967,845 | B2 | * | 11/2005 | Chiang et al. | 361/709 |

(Continued)

OTHER PUBLICATIONS

XPS™ H2C™ 710 Edition, One Cool System, Dell XPS 710 H2C Desktop Product Details, Oct. 2006, Dell Inc., http://www.dell.com/content/products/productdetails.aspx/xpsdt_710h2c?c=us&l=en&s=d.

*Primary Examiner*—Jayprakash N Gandhi
*Assistant Examiner*—Bradley H Thomas
(74) *Attorney, Agent, or Firm*—Haynes and Boone, LLP

(57) ABSTRACT

In an embodiment, a heat conduction apparatus includes a heat sink. A coupling member is located on the heat sink. The coupling member is operable to releaseably and interchangeably couple one of a selected blank member and a cold plate to the heat sink in response to a cooling requirement of the heat sink. In an embodiment, a method of cooling an information handling system includes providing cooling by coupling a heat sink to a heat generating component. The method further provides selectably coupling a blank member to the heat sink providing cooling by a first fluid coolant. The method further provides selectably coupling a cold plate to the heat sink providing cooling by a first fluid coolant and a second fluid coolant.

18 Claims, 9 Drawing Sheets

U.S. PATENT DOCUMENTS

| | | |
|---|---|---|
| 7,011,144 B2 * | 3/2006 | Zeighami et al. ....... 165/104.21 |
| 7,086,247 B2 | 8/2006 | Campbell et al. |
| 7,088,585 B2 | 8/2006 | Chu et al. |
| 7,256,997 B2 * | 8/2007 | Chen et al. ................. 361/697 |
| 2002/0000239 A1 * | 1/2002 | Sachdev et al. ................ 134/2 |
| 2003/0230398 A1 * | 12/2003 | Lee et al. ............... 165/104.21 |
| 2004/0035558 A1 * | 2/2004 | Todd et al. ............. 165/104.26 |
| 2005/0141196 A1 * | 6/2005 | Yamatani et al. ............ 361/699 |
| 2005/0256241 A1 * | 11/2005 | Sachdev et al. ............. 524/439 |
| 2006/0146499 A1 * | 7/2006 | Reents ....................... 361/704 |
| 2006/0289149 A1 * | 12/2006 | He ........................ 165/104.33 |
| 2007/0042514 A1 * | 2/2007 | Wu et al. ...................... 438/17 |
| 2007/0153476 A1 * | 7/2007 | Yang et al. .................. 361/695 |
| 2007/0227699 A1 * | 10/2007 | Nishi .......................... 165/96 |
| 2008/0041566 A1 * | 2/2008 | Scott ..................... 165/104.33 |

* cited by examiner

HEAT CONDUCTION APPARATUS PROVIDING FOR SELECTIVE CONFIGURATION FOR HEAT CONDUCTION

BACKGROUND

The present disclosure relates generally to information handling systems, and more particularly to a heat conduction apparatus for use with an information handling system, the heat conduction apparatus allowing for the selective use of multiple fluids for cooling.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

As the performance and operating frequency requirements of IHSs increase and the size of IHS chassis decrease, there has been a dramatic increase in the heat generation density of the IHS chassis. This may cause IHS performance and reliability issues as many IHS components, such as, for example, processors and memory integrated circuits, have stringent junction temperature requirements that must be met in order to ensure proper component performance and reliability. As such, there is a need to dissipate heat from the heat generating component to reduce the component's case temperature and consequently, its junction temperature. The reduction of a component's case temperature may be challenging however, especially for those components included in IHS chassis located in large data centers that include numerous IHSs. Powerful fans may be used to dissipate heat from the components; however, fans require substantial power, increasing the cost of the IHS operation. In addition, fans can cause acoustical issues for IHS users due to the noise generated by their operation. As such, additional heat conduction apparatuses are needed to decrease the dependency on fans; however, conventional passive devices such as, for example, heat sinks may not provide enough dissipation to adequately reduce the dependency on fans. Additionally, though more sophisticated heat conduction apparatuses may be available, the IHS user may be reluctant to incur the costs of installing these apparatuses when first purchasing the IHS.

Accordingly, it would be desirable to provide for enhanced heat conduction absent the disadvantages found in the prior methods discussed above.

SUMMARY

According to one embodiment, a heat conduction apparatus includes a heat sink and a coupling member located on the heat sink and operable to releaseably and interchangeably couple one of a selected blank member and a cold plate to the heat sink in response to a cooling requirement of the heat sink.

BRIEF DESCRIPTION OF THE DRAWINGS

FIG. 2b is a cross-sectional view illustrating an embodiment of the heat sink of FIG. 2a.

FIG. 3b is a cross-sectional view illustrating an embodiment of the cold plate of FIG. 3a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU), or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
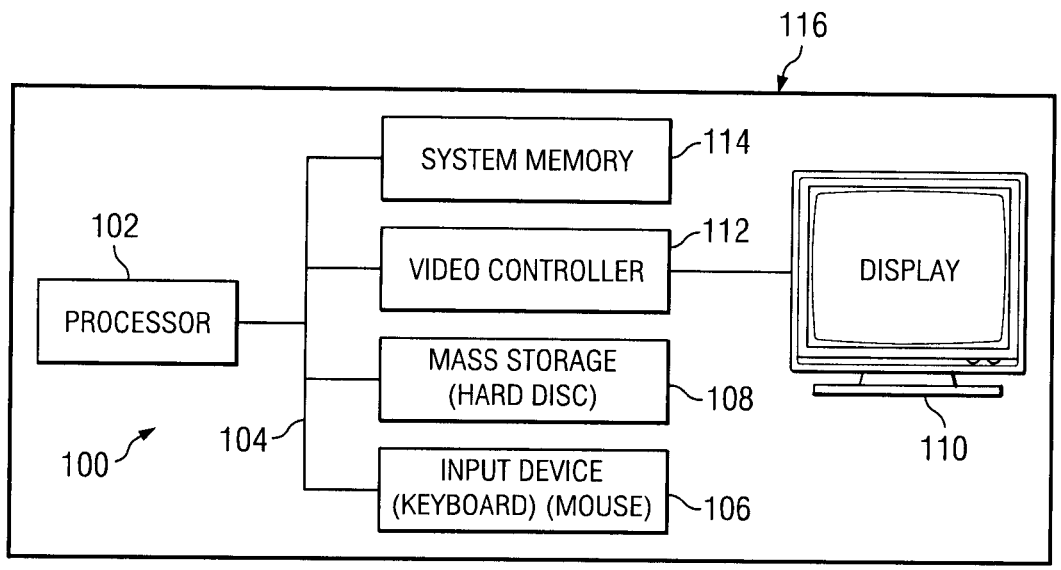
FIG. 1 is a schematic view illustrating an embodiment of an IHS.

In one embodiment, IHS 100, FIG. 1, includes a processor 102, which is connected to a bus 104. Bus 104 serves as a connection between processor 102 and other components of computer system 100. An input device 106 is coupled to processor 102 to provide input to processor 102. Examples of input devices include keyboards, touchscreens, and pointing devices such as mouses, trackballs, and trackpads. Programs and data are stored on a mass storage device 108, which is coupled to processor 102. Mass storage devices include such devices as hard disks, optical disks, magneto-optical drives, floppy drives and the like. IHS 100 further includes a display 110, which is coupled to processor 102 by a video controller 112. A system memory 114 is coupled to processor 102 to provide the processor with fast storage to facilitate execution of computer programs by processor 102. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
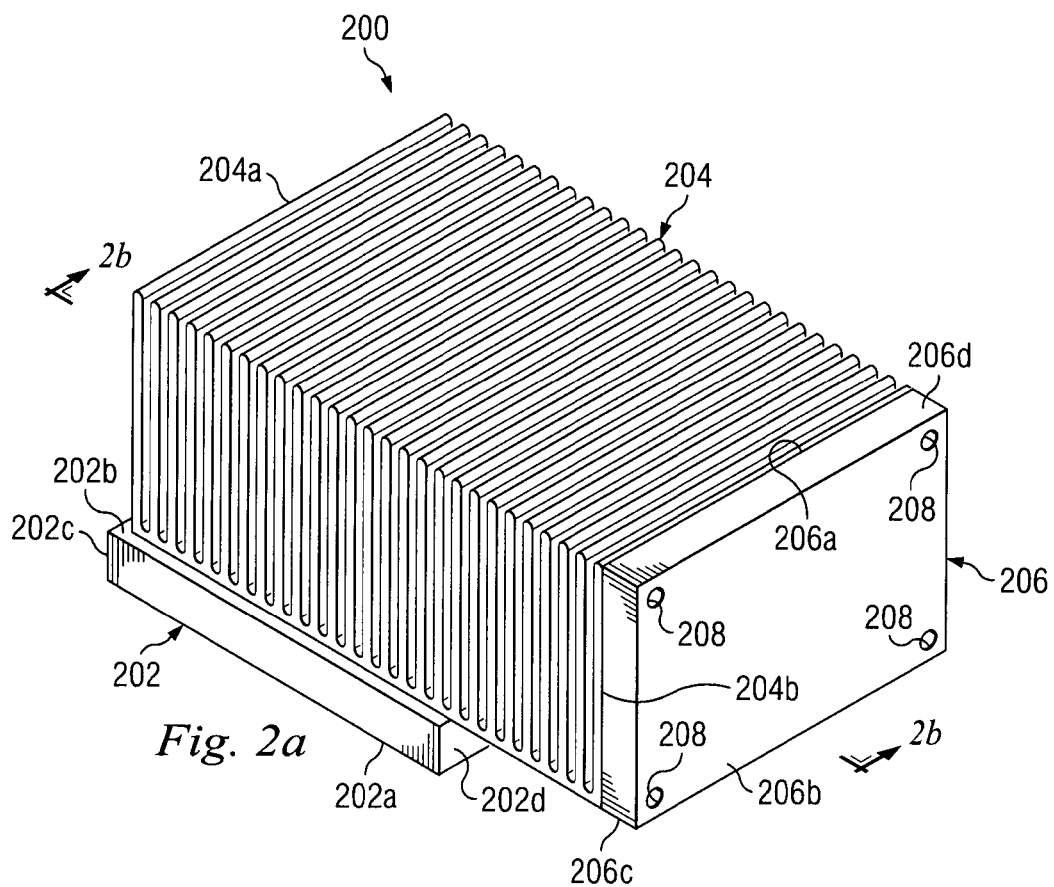
FIG. 2a is a perspective view illustrating an embodiment of a heat sink.
Figure 2B:
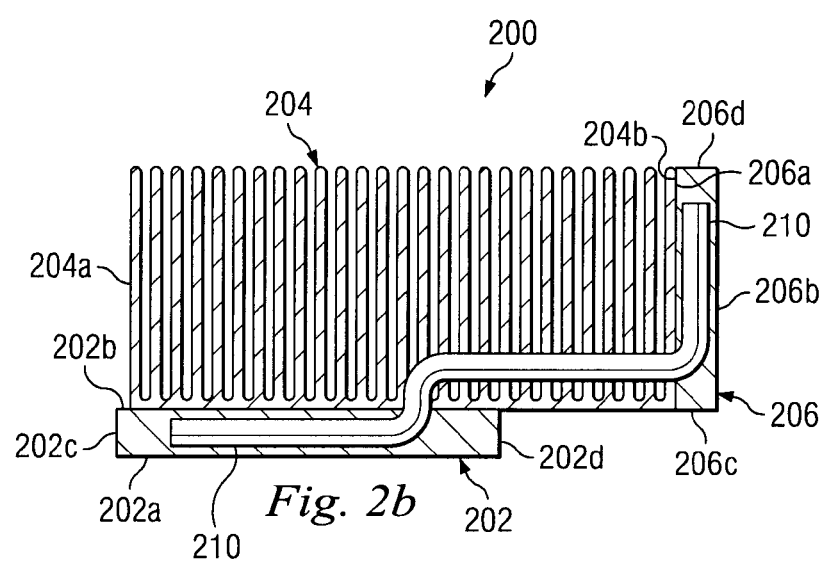

Referring now to FIGS. 2a and 2b, a heat sink 200 is illustrated. The heat sink 200 includes a base 202 having a bottom surface 202a, a top surface 202b opposite the bottom surface 202a, a rear surface 202c extending between the bottom surface 202a and the top surface 202b, and a front surface 202d located opposite the rear surface 202c and extending between the bottom surface 202a and the top surface 202b. A plurality of fins 204 extend from the top surface 202b of the base 202 with each fin extending in a substantially perpendicular direction to the top surface 202b. The plurality of fins 204 has a first end 204a substantially coplanar with the rear surface 202c of the base 202 and a distal end 204b extending past the front surface 202d of the base 202 and located opposite the first end 204a. The heat sink 200 also includes a heat sink end piece 206 having a rear surface 206a, a coupling surface 206b located opposite the rear surface 206a, a bottom surface 206c extending between the rear surface 206a and the coupling surface 206b, and a top surface 206d located opposite the bottom surface 206a and extending between the rear surface 206a and the coupling surface 206b. The heat sink end piece 206 is coupled to the distal end 204b of the plurality of fins 204 by the engagement of the rear surface 206a of the heat sink end piece 206 and the distal end 204b of the plurality of fins 204. In the illustrated embodiment, a plurality of heat pipes 210 extend through the base 202 from a location adjacent the rear surface 202c of the base 202 to a location adjacent the front surface 202d of the base 202, upward into the plurality of fins 204, through the plurality of fins 204 to the heat sink end piece 206, and through the heat sink end piece 206 from a location adjacent the bottom surface 206c to a location adjacent the top surface 206d of the heat sink end piece 206. However, other heat pipe locations are possible. In an embodiment, no heat pipes are included in the heat sink 200. In an embodiment, other heat transfer components such as, for example, graphite inserts, conductive material slugs such as copper slugs, and/or liquid loops may be included with the heat sink 200. In an embodiment, the base 202 of the heat sink 200, the plurality of fins 204, and/or the heat sink end piece 206 are fabricated from a copper material, an aluminum material, and/or other conductive materials known in the art. A plurality of coupling members 208 is located on the coupling surface 206b of the heat sink end piece 206. In the illustrated embodiment, the coupling members 208 include a plurality of threaded apertures defined by the heat sink end piece 206 and operable to accept a screw. However other embodiments of the coupling members 208 are possible such as, for example, those including springs, fasteners; mechanical attachment assemblies (tooled or tool less designs) such as, for example, latches, and/or a variety of other connector types known in the art. In an embodiment, the coupling members 208 are integral and non-releaseably coupled to the heat sink 200 and can not be repeatedly and releaseably coupled and decoupled from the heat sink 200 by the IHS user.

Figure 3A:
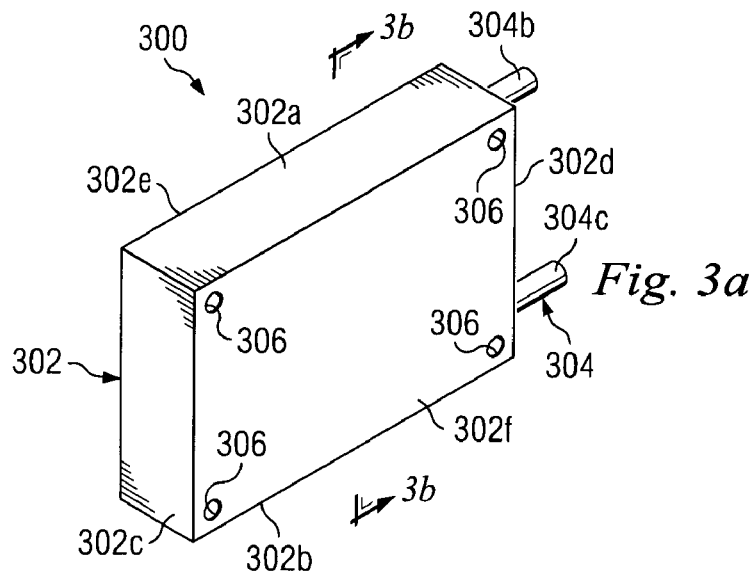
FIG. 3a is a perspective view illustrating an embodiment of a cold plate used with the heat sink of FIGS. 2a and 2b.
Figure 3B:
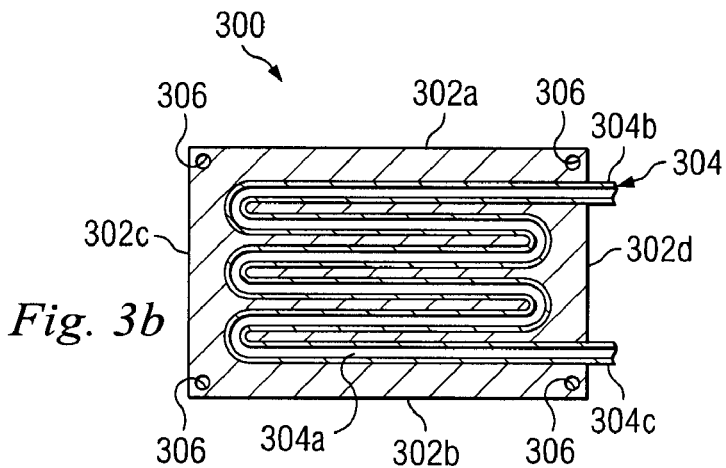

Referring now to FIGS. 3a and 3b, a cold plate 300 is illustrated. The cold plate 300 includes a base 302 having a top surface 302a, a bottom surface 302b located opposite the top surface 302a, a front surface 302c extending between the top surface 302a and the bottom surface 302b, a rear surface 302d located opposite the front surface 302c and extending between the top surface 302a and the bottom surface 302b, and a pair of opposing side surfaces 302e and 302f extending between the top surface 302a, the bottom surface 302b, the front surface 302c, and the rear surface 302d. A conduit 304 extends through the base 302 of the cold plate 300 and defines a passageway 304a located along the length of the conduit 304. The conduit 304 includes an inlet 304b to the cold plate base 302 and an outlet 304c from the cold plate base 302 each located adjacent the rear surface 302d of the base 302. In the illustrated embodiment, the conduit 304 has S-shaped curves within the base 302. However, one of skill in the art will recognize that other conduit shapes are possible. A fluid coolant may be located in the passageway 304a. The coolant may include, for example, water, a refrigerant, or a variety of other coolants known in the art. In the illustrated embodiment, a plurality of apertures 306 are defined by the base 302 and extend through the base 302 from the side surface 302f to the opposing side surface 302e of the base 302 and are operable to accept screws. In an alternative embodiment, the cold plate 300 may include different connector types in place of the apertures 306 such as, for example, springs, fasteners, mechanical attachment assemblies (tooled or tool less designs) such as, for example, latches, and/or a variety of other connector types known in the art operable to provide for releasable coupling.

Figure 4:
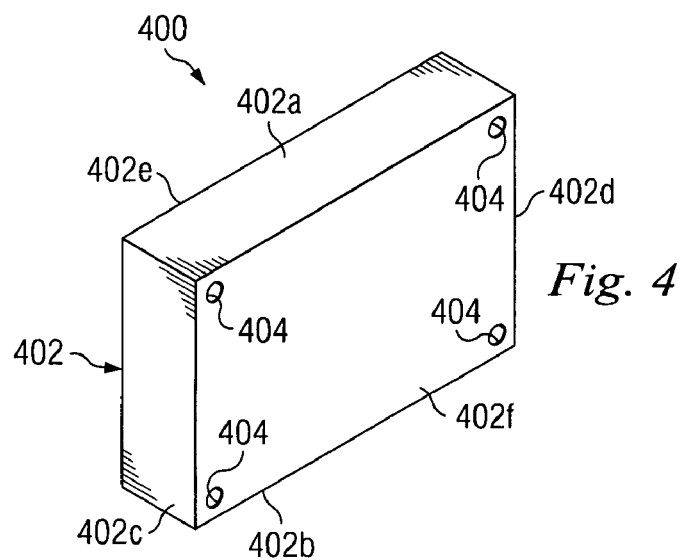
FIG. 4 is a perspective view illustrating an embodiment of a blank member used with the heat sink of FIGS. 2a and 2b.

Referring now to FIG. 4, a blank member 400 is illustrated. The blank member 400 includes a base 402 having a top surface 402a, a bottom surface 402b located opposite the top surface 402a, a front surface 402c extending between the top surface 402a and the bottom surface 402b, a rear surface 402d located opposite the front surface 402c and extending between the top surface 402a and the bottom surface 402b, and a pair of opposing side surfaces 402e and 402f extending between the top surface 402a, the bottom surface 402b, the front surface 402c, and the rear surface 402d. In an embodiment, the blank member 400 may have a variety of different form factors other than that illustrated in FIG. 4. In an embodiment, the blank member 400 is fabricated from predominately a plastic material. In the illustrated embodiment, a plurality of apertures 404 are defined by the base 402 and extend through the base 402 from the side surface 402e to the opposing side surface 402f. In an alternative embodiment, the blank member 400 may include different connector types in place of the apertures 404 such as, for example, springs, fasteners, mechanical attachment assemblies (tooled or tool less design) such as, for example, latches, and/or other connector types known in the art operable to provide for releasable coupling.

Figure 5:
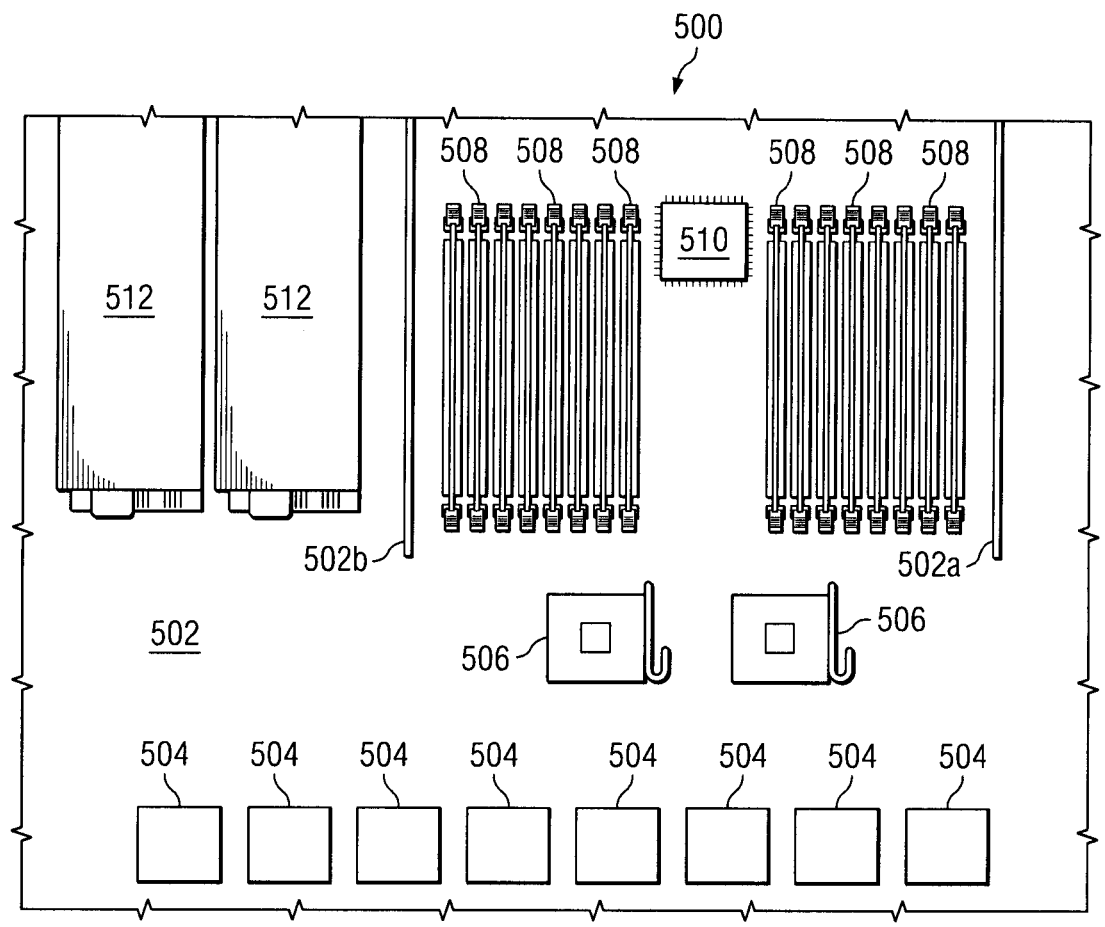
FIG. 5 is a top view illustrating an embodiment of an IHS chassis used with the heat sink of FIGS. 2a and 2b, the cold plate of FIGS. 3a and 3b, and the blank member of FIG. 4.

Referring now to FIG. 5, an IHS chassis 500 is illustrated. In an embodiment, the IHS chassis 500 may be, for example, the chassis 116, described above with reference to FIG. 1, and may house some of all of the components of the IHS 100, also described above with reference to FIG. 1. The IHS chassis 500 includes a board 502. A plurality of fans 504 are mounted to the board 502 and are located adjacent one another. A plurality of heat generating components 506 are also mounted to the board 502 and are located adjacent the plurality of fans 504 and each other. A plurality of memory components 508 are mounted to the board 502 in a substantially parallel orientation to one another and are located adjacent the heat generating components 506 opposite the plurality of fans 504. A chip set 510 is mounted to the board 502 between the memory components 508. A pair of opposing walls 502a and 502b extend from and are substantially perpendicular to the board 502. The walls 502a and 502b are located adjacent the memory components 508 and are substantially parallel to the memory components 508. A pair of power supplies 512 are mounted to the board 502 and are located adjacent the wall 502b and the plurality of fans 504. In an embodiment, the heat generating component 506 may include the processor 102, described above with reference to FIG. 1. Other arrangements of components of the IHS chassis 500 are possible and additional components may be mounted to the board 502. In an embodiment, the IHS chassis 500 is a server chassis. In an embodiment, the IHS chassis 500 includes features known in the art that allow the IHS chassis 500 to be coupled to a server rack.

Figure 6A:
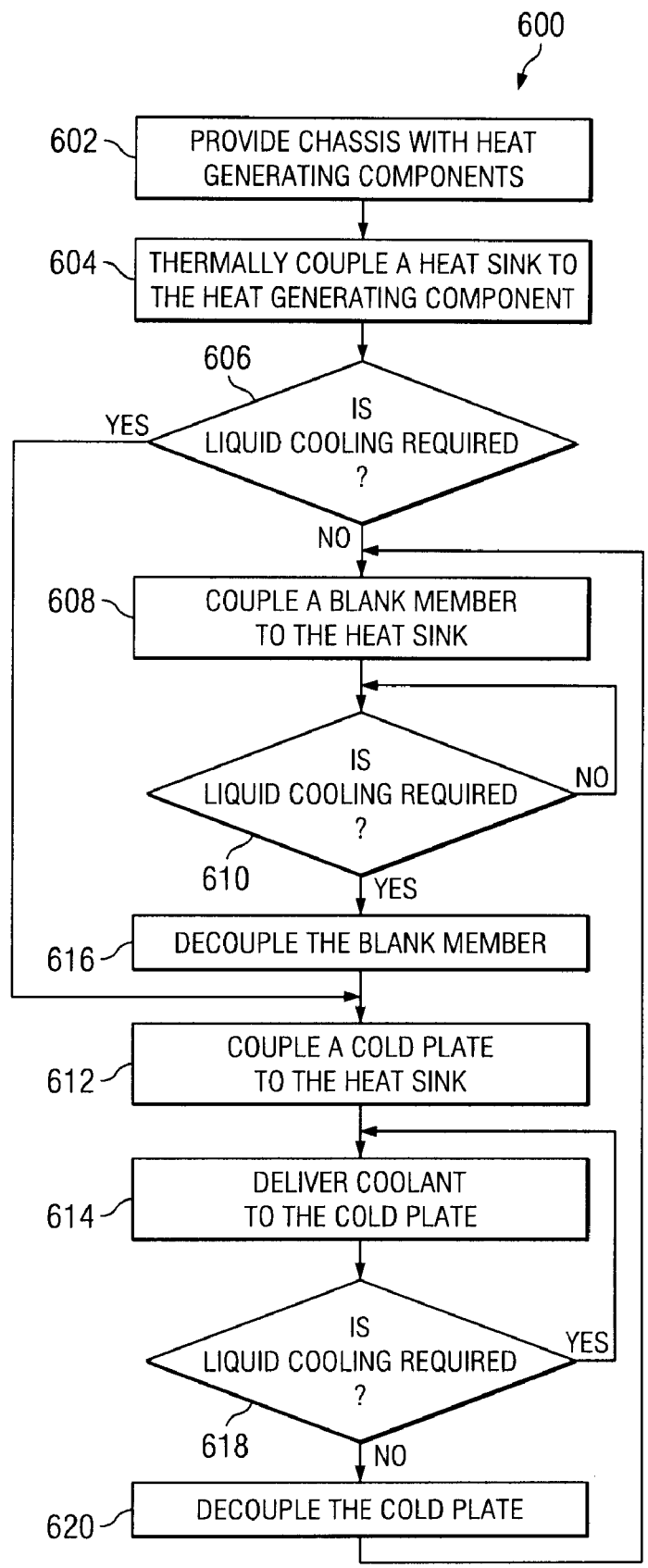
FIG. 6a is a flow chart illustrating an embodiment of a method of dissipating heat from a heat generating component.
Figure 6B:
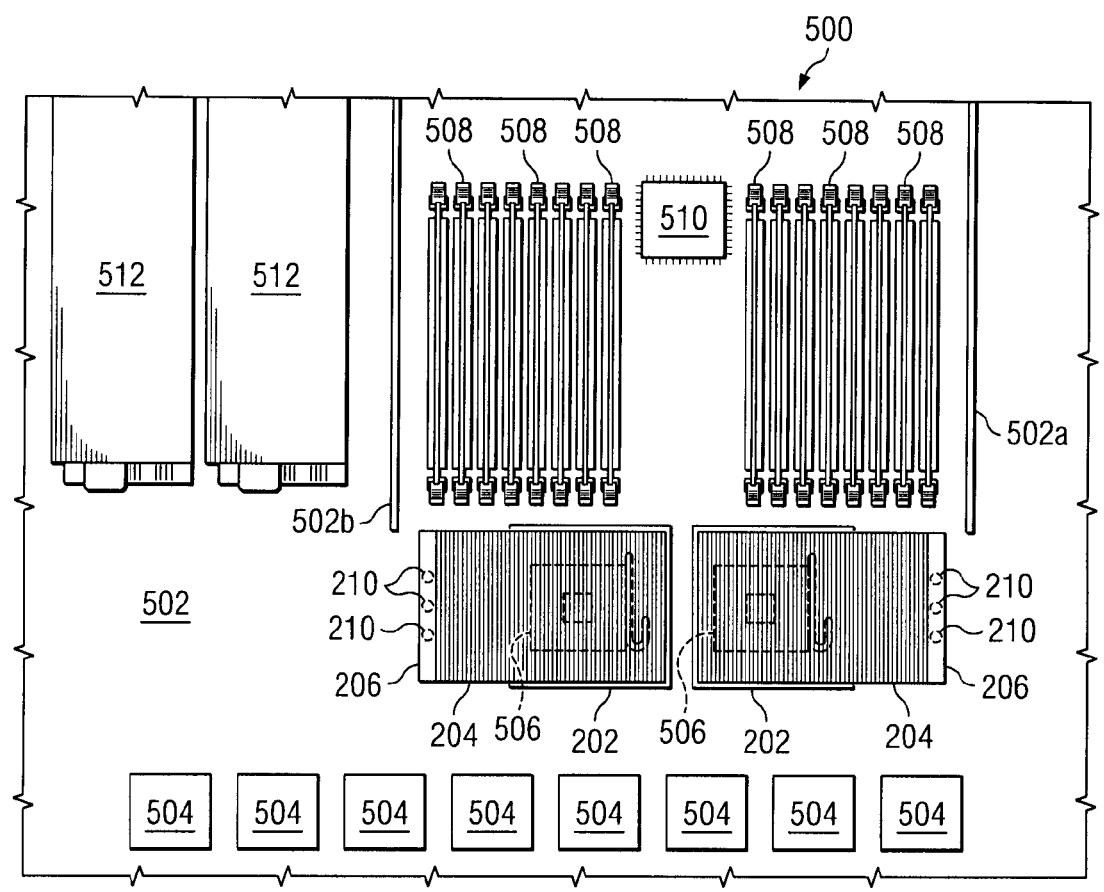
FIG. 6b is a top view illustrating an embodiment of the IHS chassis of FIG. 5 including the heat sink of FIGS. 2a and 2b.

Referring now to FIGS. 2a, 2b, 5, 6a and 6b, a method 600 for dissipating heat from a heat generating component is illustrated. The method 600 begins at step 602 where a chassis with a heat generating component is provided. The IHS chassis 500 with the heat generating components 506 is provided. The method 600 then proceeds to step 604 where a heat sink is thermally coupled to the heat generating component. The heat sink 200 is thermally coupled to each of the heat generating components 506 by coupling the bottom surface 202a of the base 202 of the heat sink 200 to the top surface of the heat generating component 506, as illustrated in FIG. 6b. The method 600 then continues to decision block 606 where a determination is made if liquid cooling is required. The liquid cooling may allow substantially all of the heat, of the component to which the heat sink is thermally coupled to, to be transferred to the coolant provided by the liquid cooling. The transfer of the energy in the form of heat from the heat generating component to the liquid may allow for removing heat from the IHS in which the heat generating component is located and may additionally remove heat from the IHS surroundings. This addition of liquid cooling may lower the cooling requirements from other sources such as, for example, fans. In an embodiment, the determination to provide liquid cooling is made using factors such as, for example, the costs including the cost of fan operation and the cost of liquid cooling, the amount of heat generated, the case temperature and junction temperature requirements of the IHS components, and/or the efficiency of the heat conduction apparatus.

Figure 6C:
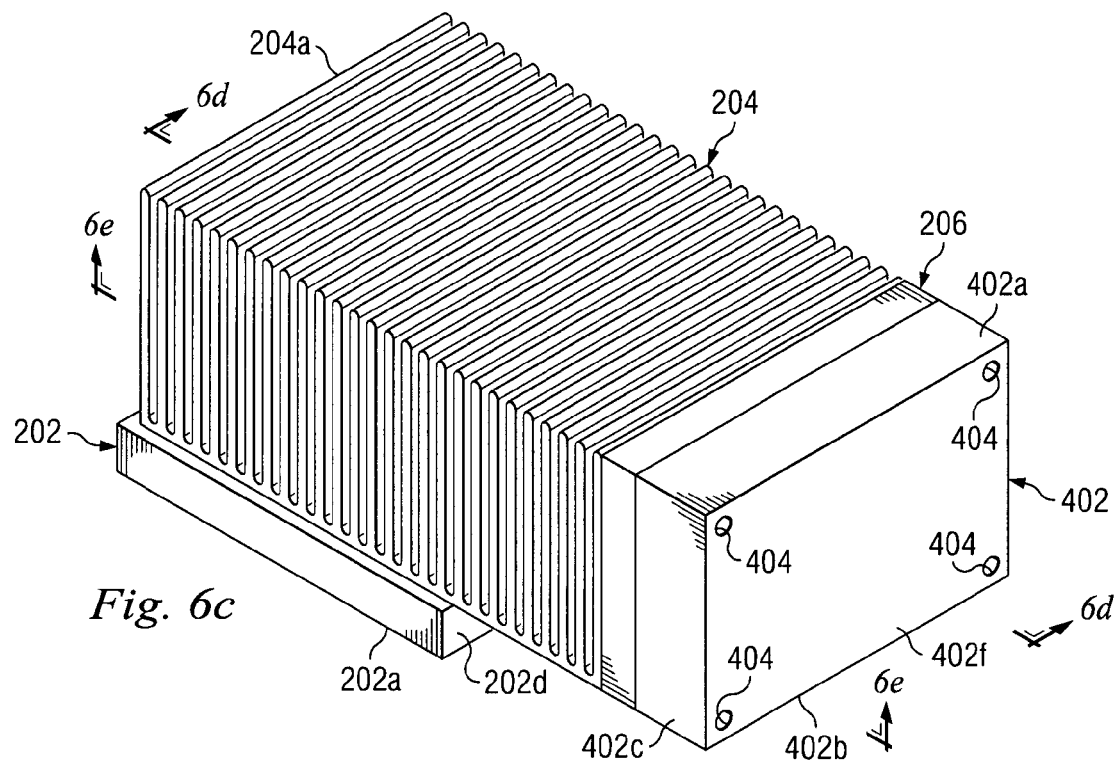
FIG. 6c is a perspective view illustrating an embodiment of the blank member of FIG. 4 coupled to the heat sink of FIGS. 2a and 2b.
Figure 6D:
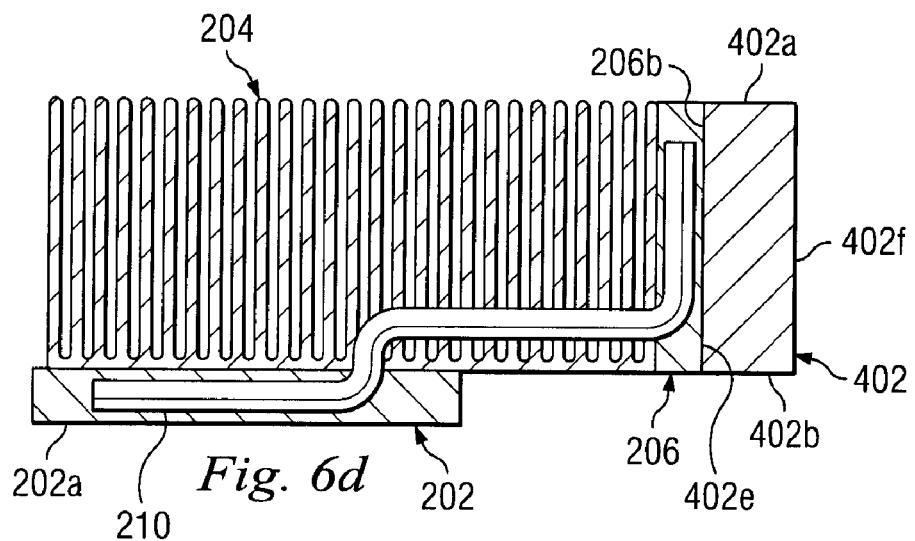
FIG. 6d is a cross-sectional view illustrating an embodiment of the blank member of FIG. 4 coupled to the heat sink of FIGS. 2a and 2b.
Figure 6E:
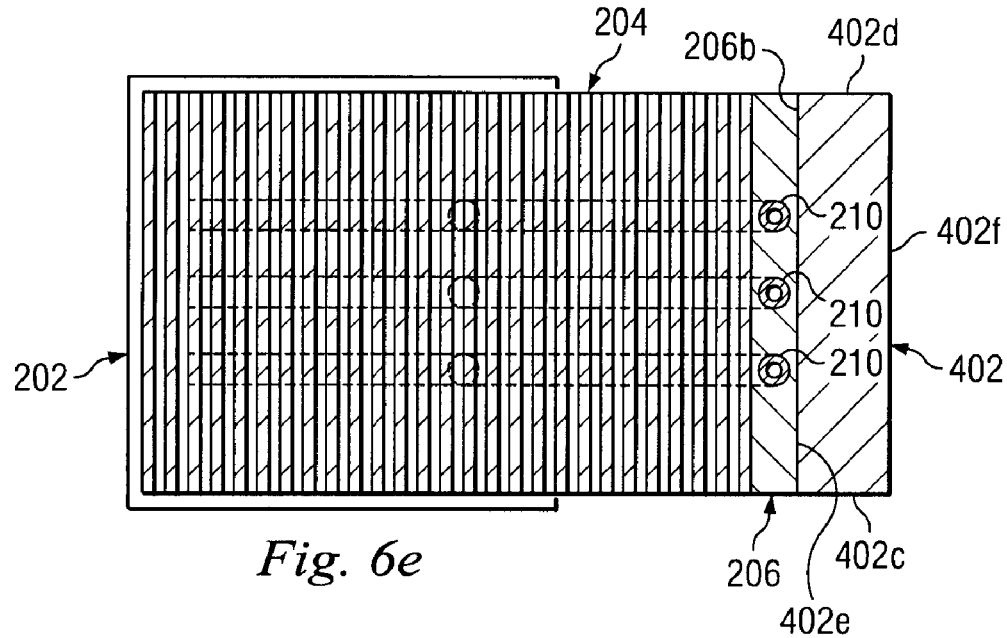
FIG. 6e is a cross-sectional view illustrating an embodiment of the blank member of FIG. 4 coupled to the heat sink of FIGS. 2a and 2b.
Figure 6F:
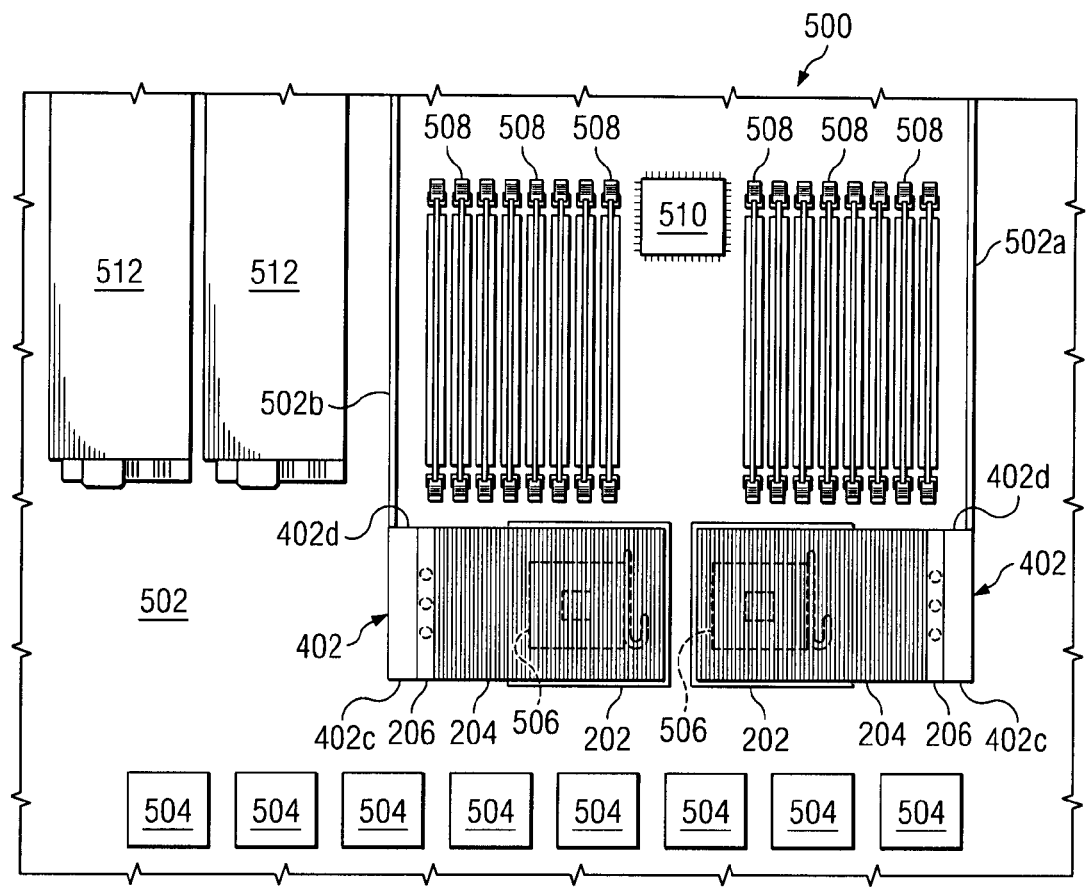
FIG. 6f is a top view illustrating an embodiment of the blank member of FIG. 4 coupled to the heat sink in the IHS chassis of FIG. 6b.
Figure 6G:
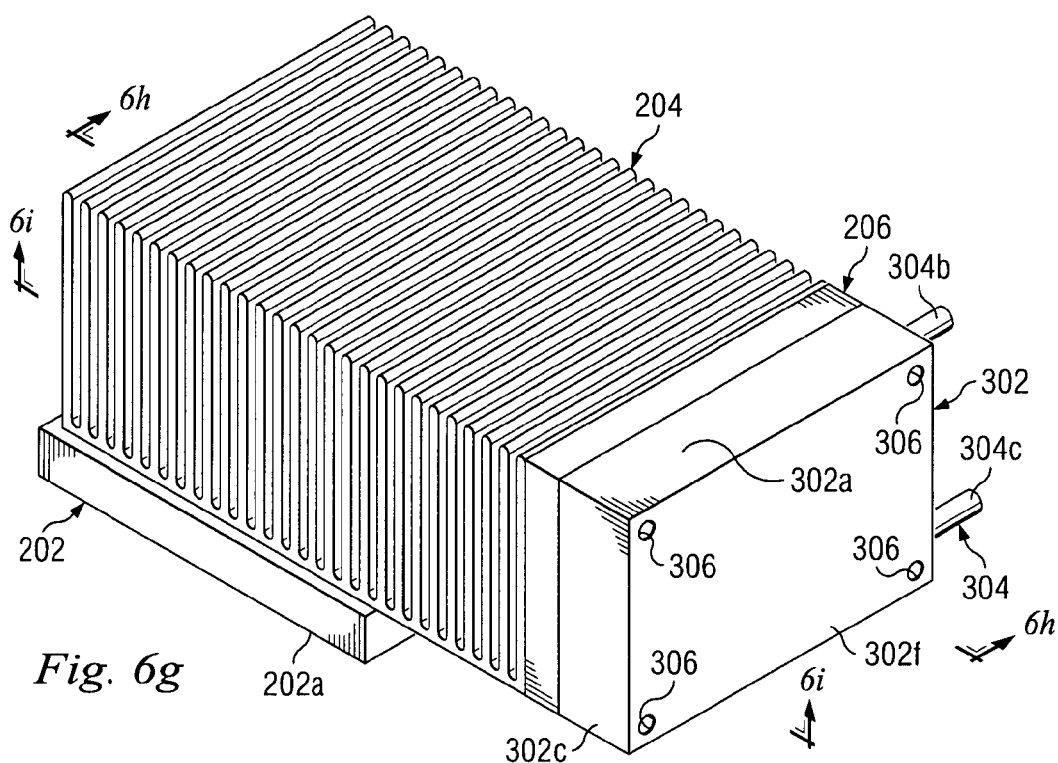
FIG. 6g is a perspective view illustrating an embodiment of the cold plate of FIGS. 3a and 3b coupled to the heat sink of FIGS. 2a and 2b.
Figure 6H:
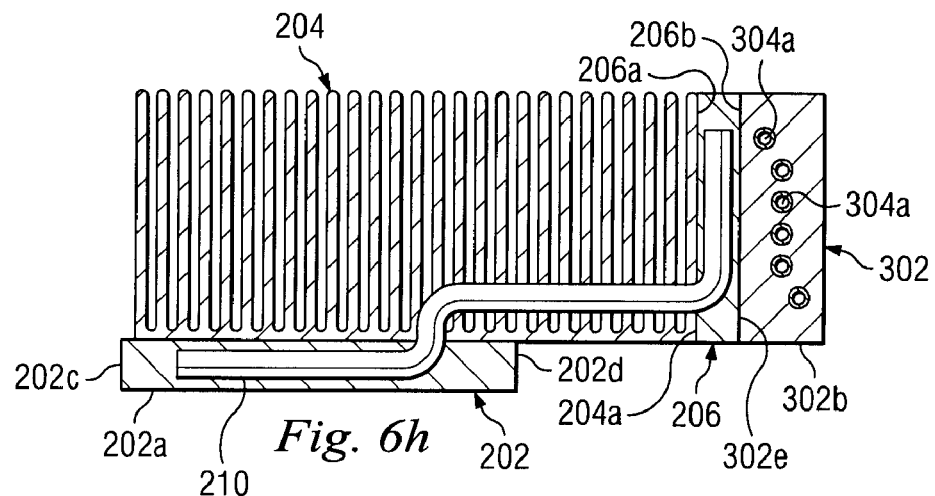
FIG. 6h is a cross-sectional view illustrating an embodiment of the cold plate of FIGS. 3a and 3b coupled to the heat sink of FIGS. 2a and 2b.
Figure 6I:
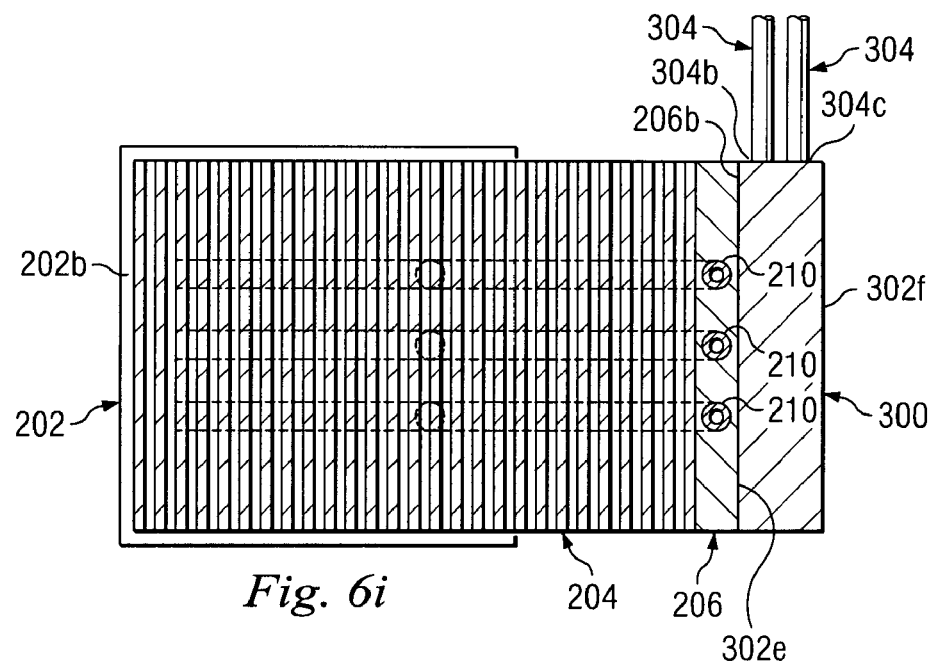
FIG. 6i is a cross-sectional view illustrating an embodiment of the cold plate of FIGS. 3a and 3b coupled to the heat sink of FIGS. 2a and 2b.

Referring now to FIGS. 2a, 2b, 4, 6a, 6b, 6c, 6d, 6e and 6f, in an embodiment of the method 600, in decision block 606 a determination is made that liquid cooling is not required, and as such, the method 600 continues to step 608 where a blank member is coupled to the provided heat sink. In an embodiment, the blank member 400 is coupled to the heat sink 200 by engaging of the side surface 402e of the blank member 400 and the coupling surface 206b of the heat sink end piece 206. In an embodiment, screws are positioned in the apertures 404 of the blank member 400 and the coupling members 208 of heat sink 200 to releaseably couple the blank member 400 to the heat sink 200, as illustrated in FIGS. 6c, 6d and 6e. In an embodiment, springs, fasteners, mechanical attachment assemblies (tooled or tool less designs) such as, for example, latches, and/or a variety of other connector types known in the art releaseably couple the blank member 400 and the heat sink 200. In an embodiment, the releasable coupling is such that the blank member 400 can be repeatedly coupled to and decoupled from the heat sink 200. In an embodiment, the blank member 400 may operate to limit air from the fans 504 from bypassing the heat sink 200, thus forcing the air through the plurality of fins 204 of the heat sink 200, as opposed to allowing the air an alternative path around the heat sink 200 and between the walls 502b and 502c and the heat sink 200, as illustrated in FIG. 6f. The method 600 then continues to decision block 610 where monitoring is done to determine if liquid cooling is required. In an embodiment, the monitoring and/or determination are performed by an IHS user. An IHS user is one who operates the IHS after the IHS has left the control of the IHS manufacturer. In an embodiment, the IHS user is the purchaser of the IHS. In an embodiment, the determination to provide liquid cooling is made using factors such as, for example, the costs including the cost of fan operation and the cost of liquid cooling, the amount of heat generated, the case temperature and junction temperature requirements of the IHS components, and/or the efficiency of the heat conduction apparatus. If no liquid cooling is required, the IHS chassis is continually operated and the monitoring for liquid cooling continues in decision block 610. If the determination is that liquid cooling is required, then the method 600 continues to step 616 as described below.

Referring now to FIGS. 2a, 2b, 3a, 3b, 6a, 6b, 6g, 6h, 6i and 6j, in an embodiment of the method 600, in decision block 606 a determination is made that liquid cooling is required and as such, the method 600 continues to step 612 where a cold plate is coupled to the provided heat sink. In an embodiment, the cold plate 300 is coupled to the heat sink 200 by engaging the side surface 302e of the cold plate 300 with the coupling surface 206b of the heat sink end piece 206. In an embodiment, screws are placed in the apertures 306 of the cold plate 300 and the coupling members 208 of the heat sink 200 to releaseably couple the cold plate 300 and the heat sink 200, as illustrated in FIGS. 6g, 6h, 6i and 6j. In an embodiment, springs, fasteners, mechanical attachment assemblies (tooled or tool less designs) such as, for example, latches, and/or a variety of other connector types known in the art releaseably couple the cold plate 300 and the heat sink 200. In an embodiment, the releasable coupling is such that the cold plate 300 can be repeatedly coupled to and decoupled from the heat sink 200.

Figure 6J:
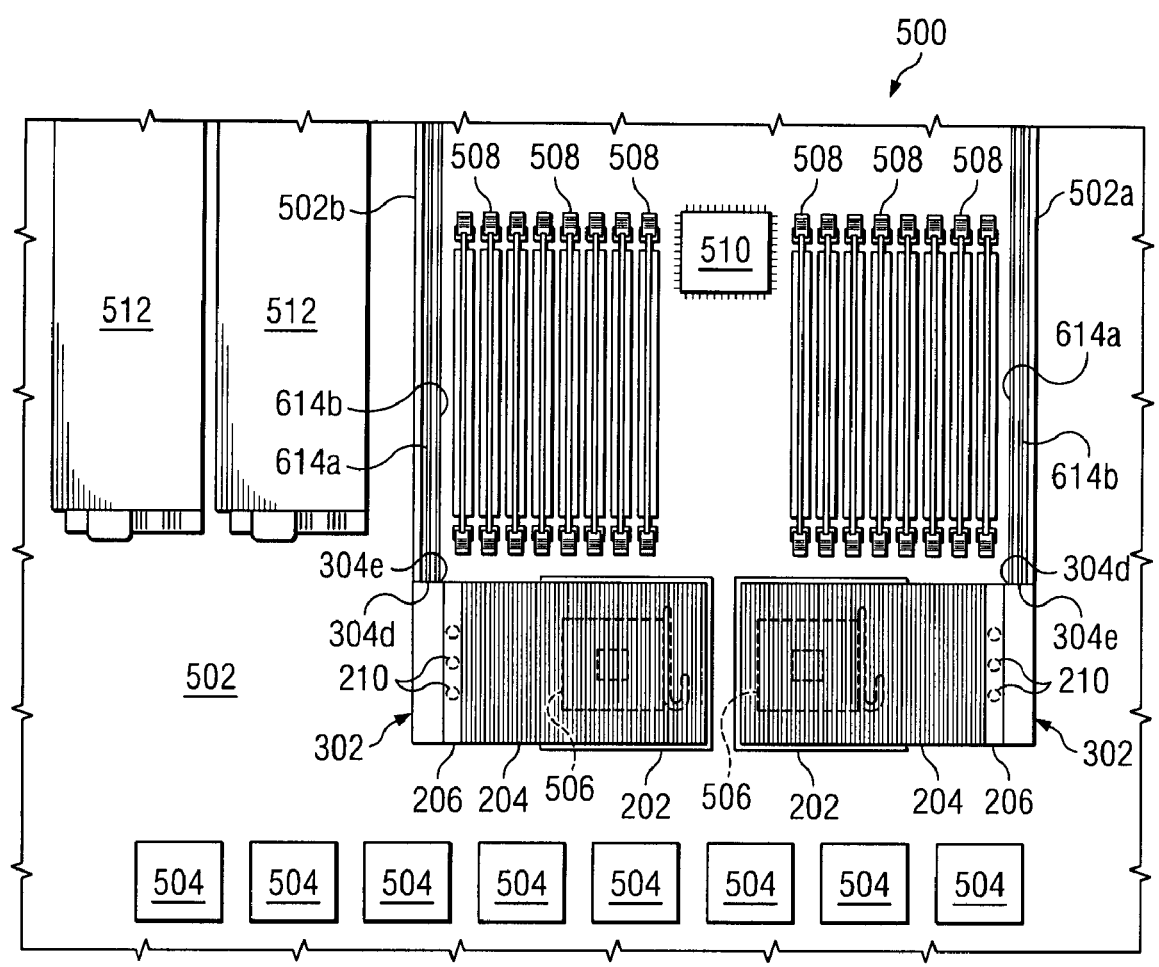
FIG. 6j is a top view illustrating an embodiment of the cold plate of FIGS. 3a and 3b coupled to the heat sink in the IHS chassis of FIG. 6b.

The method 600 then continues to step 614 where a fluid coolant is delivered to the cold plate 300 to provide liquid cooling. The coolant may be located in the passageway 304a of the cold plate 300. The coolant is delivered to the cold plate 300 through the inlet 304b. The coolant circulates through the base 302 of the cold plate 300 in the passageway 304a and exits the base 302 through the outlet 304c. The coolant may be at a lower temperature at the inlet 304b than at the outlet 304c as the coolant may absorb energy in the form of heat while circulating in the base 302. In an embodiment, the conduit 304 is connected to conduits 614a and 614b, as illustrated in FIG. 6j. The conduit 614a delivers coolant to the cold plate 300; the conduit 614b transfers the coolant away from the cold plate 300. In an embodiment, the conduit 614b returns the coolant to be chilled and re-circulated to the cold plate 300. In an embodiment, the coolant may include water, a refrigerant, or other coolant as known in the art. The coolant may be from a source outside of the IHS. For example, in an embodiment, the coolant includes water circulating from the general facilities of the IHS location. In an embodiment, the IHS chassis 500 is coupled to a server rack and the coolant is contained in a basin, a source outside of the IHS, providing coolant to a plurality of IHS chassis coupled to the server rack including the IHS chassis 500. Facilities water may be used to maintain the temperature of the coolant in the basin. In an embodiment, the flow rate of the coolant is variable and controllable by the IHS user. Air adjacent the plurality of fins 204 of the heat sink 200 may continue to provide cooling in addition to the coolant provided by the cold plate 300. In an embodiment, the cold plate 300 limits may also operate to limit air from the fans 504 from bypassing the heat sink 200, thus forcing the air through the plurality of fins 204 of the heat sink 200, as opposed to allowing the air an alternative path around the heat sink 200. In an embodiment, the temperature of the air from the fans 310 may be greater when entering the plurality of fins 204 of the heat sink 200 than when exiting the plurality of fins 204 of the heat sink 200, providing additional cooling to the downstream components such as, for example, the memory components 508. After the coolant is provided in step 614, the method 600 continues to decision block 618 where monitoring is done to determine if liquid cooling is still required. In an embodiment, the monitoring and/or determination are performed by the IHS user. In an embodiment, the determination to continue to provide liquid cooling is made using factors such as, for example, the costs including the cost of fan operation and the cost of liquid cooling, the amount of heat generated, the case temperature and junction temperature requirements of the IHS components, and/or the efficiency of the heat conduction apparatus. If liquid cooling is required, the method 600 continues to step 614 where coolant is provided and the monitoring of decision block 618 is performed. If liquid cooling is no longer required, the method 600 continues to step 620 as described below.

In an embodiment, the cold plate 300 and the blank member 400 are interchangeably coupled to the heat sink 200 in that either the cold plate 300 or the blank member 400 may be coupled to the heat sink 200 at any given time. As such, the IHS chassis 500 may be operated with one configuration, for example, including the cold plate 300, and then changed to another configuration, for example, including the blank member 400. In an embodiment, the heat sink 200 and the blank member 400 use the same connector member such as, for example, the connector members 208. In an embodiment of the method 600, in decision block 610, a determination is made that liquid cooling is required. As such, the method 600 continues to step 616 where the blank member 400 is decoupled from the heat sink 200. The method 600 then proceeds to step 612 where the cold plate 300 is coupled to the heat sink 200 and coolant is delivered, as described above with reference to steps 612 and 614 of the method 600. In an embodiment, the IHS user may have operated the IHS chassis 500 for an extended period of time before making the determination that liquid cooling is required. In an embodiment, the decoupling of the blank member 400 and coupling of the cold plate 300 is performed by the IHS user. In an embodiment of the method 600, a determination is made at decision block 618 that the liquid cooling provided is no longer required. As such, the method 600 continues to step 620 where the cold plate 300 is decoupled from the heat sink 200. The method 600 then continues to step 608 where the blank member 400 is coupled to the heat sink 200, as described above with reference to step 608, and the method 600 continues as described above. In an embodiment, the IHS user may have operated the IHS chassis 500 for an extended period of time before the determination in decision block 618 that liquid cooling is no longer required. In an embodiment, the decoupling of the cold plate 300 and the coupling of the blank member 400 is performed by the IHS user. In an embodiment, the IHS user may purchase the IHS chassis 500 with a heat conduction apparatus including the blank member 400 coupled to the heat sink 200, and at a later point in time, decouple the blank member 400 and couple the cold plate 300 to the heat sink 200. In an alternative embodiment, the IHS user may purchase the IHS chassis 500 with a heat conduction apparatus including cold plate 300 coupled to the heat sink 200, and at a later point in time, decouple the cold plate 300 and couple the blank member 400. Thus, a heat conduction apparatus is provided that allows for releasable and interchangeable coupling of a blank member and a cold plate.

Thus, a heat conduction apparatus is provided that allows for cooling by means of a plurality of coolant fluids, the coolant fluid provided depending upon the selected configuration of the heat conduction apparatus. A first configuration may allow the heat conduction apparatus to provide cooling by means of a fluid coolant such as, for example, air. In an embodiment, air is forced through fins of the heat conduction apparatus to provide for cooling. In an embodiment, in the first configuration of the heat conduction apparatus the air is limited from bypassing the fins of the heat conduction apparatus by coupling a blank member to the heat conduction apparatus. A second configuration alternatively may allow for the heat conduction apparatus to provide for cooling by means of a plurality of fluid coolants such as, for example, air and water or air and refrigerant. In a second configuration of the heat conduction apparatus a fluid coolant may be provided by coupling a cold plate to the heat conduction apparatus. In an embodiment, the second configuration of the heat conduction apparatus provides for air adjacent the fins of the heat conduction apparatus to provide for cooling and for a fluid coolant located in a cold plate thermally coupled to the heat conduction apparatus to provide for additional cooling. In an embodiment, the selecting of the heat conduction apparatus configuration is performed by an IHS user.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A heat conduction apparatus, comprising:

a heat sink having a base, a plurality of fins and an end plate;

a fluid transfer cooling member extending through the base, the fins and the end plate; and a surface of the end plate including a coupling member operable to releasably and interchangeably couple one of a selected blank member and a cold plate to the end plate in response to a cooling requirement of the heat sink, wherein the blank member includes a plastic material;

the cold plate including a first single surface in contact with the surface of the end plate, and also including a third single surface opposing the first single surface, and including a fluid conduit within the cold plate;

upon interchange of the cold plate and the blank member, the blank member including a second single surface in contact with the surface of the end plate in replacement of the cold plate, the blank member also including a fourth single surface opposing the second single surface and being free of any fluid conduit therein or any means of moving a cooling fluid therethrough and the cold plate including conduit means for moving a cooling fluid therethrough; and each of the cold plate and the blank member including a coupling member aperture aligned with the coupling member of the end plate and extending from the third and fourth single surfaces respectively of the cold plate and the blank member to accommodate a fastening member for attaching one of the cold plate and the blank member to the end plate.

2. The apparatus of claim 1, further comprising:
a heat transfer component coupled to the heat sink wherein the heat transfer component includes at least one of a heat pipe, a graphite insert, a conductive material slug, and a liquid loop.

3. The apparatus of claim 1, wherein the coupling member is nonreleaseably coupled to the heat sink.

4. The apparatus of claim 1, wherein the coupling member is selected from the group consisting of a threaded aperture, a spring, a fastener, and a mechanical attachment assembly.

5. The apparatus of claim 1, further comprising:
the cold plate coupled to the coupling member and operable to provide coolant to transfer heat from the heat sink.

6. The apparatus of claim 1, further comprising:
the blank member coupled to the coupling member and operable to limit airflow bypassing the heat sink.

7. An information handling system, comprising:
a chassis;
a processor located in the chassis;
a heat conduction apparatus thermally coupled to the processor wherein the heat conduction apparatus includes a heat sink having a base, a plurality of fins and an end plate including a coupling member, wherein the coupling member is operable to releasably and interchangeably couple to one of a selected blank member and a cold plate in response to a cooling requirement of the system; and
a fluid transfer cooling member extending through the base, the fins and the end plate;
the cold plate including a first single surface in contact with the surface of the end plate, and also including a third single surface opposing the first single surface, and including a fluid conduit within the cold plate;
upon interchange of the cold plate and the blank member, the blank member including a second single surface in contact with the surface of the end plate in replacement of the cold plate, the blank member also including a fourth single surface opposing the second single surface and being free of any fluid conduit therein or any means of moving a cooling fluid therethrough and the cold plate including conduit means for moving a cooling fluid therethrough; and
each of the cold plate and the blank member including a coupling member aperture aligned with the coupling member of the end plate and extending from the third and fourth single surfaces respectively of the cold plate and the blank member to accommodate a fastening member for attaching one of the cold plate and the blank member to the end plate.

8. The system of claim 7, further comprising:
at least one heat pipe coupled to the heat sink.

9. The system of claim 7, wherein the coupling member is nonreleaseably coupled to the heat sink.

10. The system of claim 7, wherein the coupling member is selected from the group consisting of a threaded aperture, a spring, a fastener, and a mechanical attachment assembly.

11. The system of claim 7, further comprising:
the cold plate coupled to the coupling member and operable to provide coolant to transfer heat from the heat sink.

12. The system of claim 11, wherein coolant is provided to the cold plate at a flow rate that is variable by the information handling system (IHS) user.

13. The system of claim 7, further comprising:
the blank member coupled to the coupling member and operable to limit airflow bypassing the heat sink.

14. The system of claim 13, the system further comprising:
fans operable to move air over the processor, and wherein the blank member is operable limit the moved air bypassing the heat sink.

15. A method of dissipating heat from a heat generating component, comprising:
providing a heat generating component and a heat sink thermally coupled to the heat generating component, the heat sink having a base, a plurality of fins and an end plate surface including a coupling member operable to releasably and interchangeably couple one of a blank member and a cold plate to the end plate;
selecting the amount of cooling desired for the heat generating component; coupling one of a selected blank member and a cold plate to the coupling member in response to cooling amount selected, wherein the cold plate includes a first single surface in contact with the surface of the end plate and also includes a third single surface opposing the first single surface, and includes a fluid conduit within the cold plate;
upon interchange of the cold plate and the blank member, the blank member including a second single surface in contact with the surface of the end plate in replacement of the cold plate, the blank member also including a fourth single surface opposing the second single surface and being free of any fluid conduit therein or any means of moving a cooling fluid therethrough and the cold plate including conduit means for moving a cooling fluid therethrough; and
providing each of the cold plate and the blank member with a coupling member aperture aligned with the coupling member of the end plate and extending from the third and fourth single surfaces respectively of the cold plate and the blank member to accommodate a fastening member for attaching one of the cold plate and the blank member to the end plate.

16. The method of claim 15, further comprising:
limiting airflow bypassing the heat sink using the blank member;
dissipating heat from the heat generating component with the heat sink;
decoupling the blank member from the coupling member by an information handling system (IHS) user; and
coupling a cold plate to the coupling member by an IHS user.

17. The method of claim 15, wherein the coupling includes coupling a cold plate to the coupling member and supplying coolant to the cold plate to transfer heat.

18. The method of claim 17, further comprising:
supplying coolant to the cold plate;
dissipating heat from the heat generating component with the heat sink;
decoupling the cold plate from the coupling member by an information handling system (IHS) user; and
coupling a blank member to the coupling member by an IHS user.

* * * * *